(12) United States Patent
Seto et al.

(10) Patent No.: US 6,986,195 B2
(45) Date of Patent: Jan. 17, 2006

(54) ELECTRONIC COMPONENT MOUNTING APPARATUS

(75) Inventors: Katsuyuki Seto, Ota (JP); Yoshiharu Fukushima, Oizumi (JP)

(73) Assignee: Hitachi High-Tech Instruments Company, Ltd., Gunma (JP)

( * ) Notice: Subject to any disclaimer, the term of this patent is extended or adjusted under 35 U.S.C. 154(b) by 477 days.

(21) Appl. No.: 10/108,981

(22) Filed: Mar. 29, 2002

(65) Prior Publication Data

US 2002/0148108 A1    Oct. 17, 2002

(30) Foreign Application Priority Data

Mar. 30, 2001   (JP)   .............................. 2001-100872

(51) Int. Cl.
*B23P 19/00*   (2006.01)
(52) U.S. Cl. ........................... 29/740; 29/741; 29/743; 29/744; 29/DIG. 44; 414/737; 414/752
(58) Field of Classification Search .......... 29/740–743, 29/DIG. 44, 832–834; 294/64.1, 2; 414/737, 414/752, 277, 280, 286

See application file for complete search history.

(56) References Cited

U.S. PATENT DOCUMENTS

| 5,203,061 A * | 4/1993 | Hamada .................... 29/33 M |
| 5,379,514 A * | 1/1995 | Okuda et al. ................. 29/833 |
| 5,778,525 A * | 7/1998 | Hata et al. .................... 29/836 |
| 6,324,752 B1 * | 12/2001 | Wesseling et al. ............ 29/740 |
| 6,796,022 B2 * | 9/2004 | Kashitani et al. ............. 29/740 |

* cited by examiner

*Primary Examiner*—Minh Trinh
(74) *Attorney, Agent, or Firm*—Morrison & Foerster LLP

(57) ABSTRACT

The invention provides a mounting apparatus with a beam which is free from adverse effect on its performance due to thermal distortion and misalignment of its guide rails, on which the beam for mounting operation travels. One end of the beam is rotatably supported on a slide, which moves along the guide rails. Another end of the beam is also rotatably supported on another slider through a moving element. The slider and the mounting element move along the guide rail. The moving element moves in a direction perpendicular to the guide rails.

2 Claims, 6 Drawing Sheets

ELECTRONIC COMPONENT MOUNTING APPARATUS

BACKGROUND OF THE INVENTION

1. Field of the Invention

This invention is directed to an electronic component mounting apparatus including a movable beam, which moves along a pair of guide rails formed at both sides of an apparatus base, driven by driving sources located at both sides of the apparatus base, a mounting head capable of moving along the same direction as the beam, and a suction nozzle formed on the mounting head. The suction nozzle picks up an electronic component by vacuum suction and mounts it to a print board.

2. Description of the Related Art

Ideally, a mounting apparatus has a pair of guide rails, along which a beam moves, at both sides of its apparatus base, which are aligned perfectly parallel. But, in general, deviation from perfect parallel alignment occurs during the assembly. Also, while the guide rail is made of iron, the beam is usually made of aluminum so that the beam is light for high-speed movement.

The electronic component mounting apparatus, especially its driving source for beam movement, generates a large amount of heat. Since the thermal expansion differs between iron and aluminum, the heat may cause distortion of the beam shape. This, as well as misalignment of the guide rails, is an adverse influence on the beam movement. There is even a possibility of breaking the guide rail.

SUMMARY OF THE INVENTION

Therefore, this invention is directed to nullifying such adverse influence on a beam movement for mounting an electronic component.

The invention provides an electronic component mounting apparatus, which includes a movable beam for moving along a first guide rail and a second guide rail. The first rail is disposed along a first side of an apparatus base and the second rail is disposed along a second side of the apparatus base. The first side and the second side are approximately parallel to each other. The apparatus also includes a first driving source and a second driving source for driving the movable beam. The first driving source is disposed at the first side and the second driving source is disposed at the second side. The apparatus further includes a mounting head for moving along the movable beam driven by a third driving source. A suction nozzle is disposed on the mounting head. The suction nozzle picks up an electronic component by vacuum suction and mounts the electronic component on a print board. In this configuration, a first end of the movable beam is rotatably supported on the apparatus base, and a second end of the movable beam is rotatably supported on the apparatus base and is movable in a direction approximately perpendicular to the guide rails.

DESCRIPTION OF THE INVENTION

Figure 1:
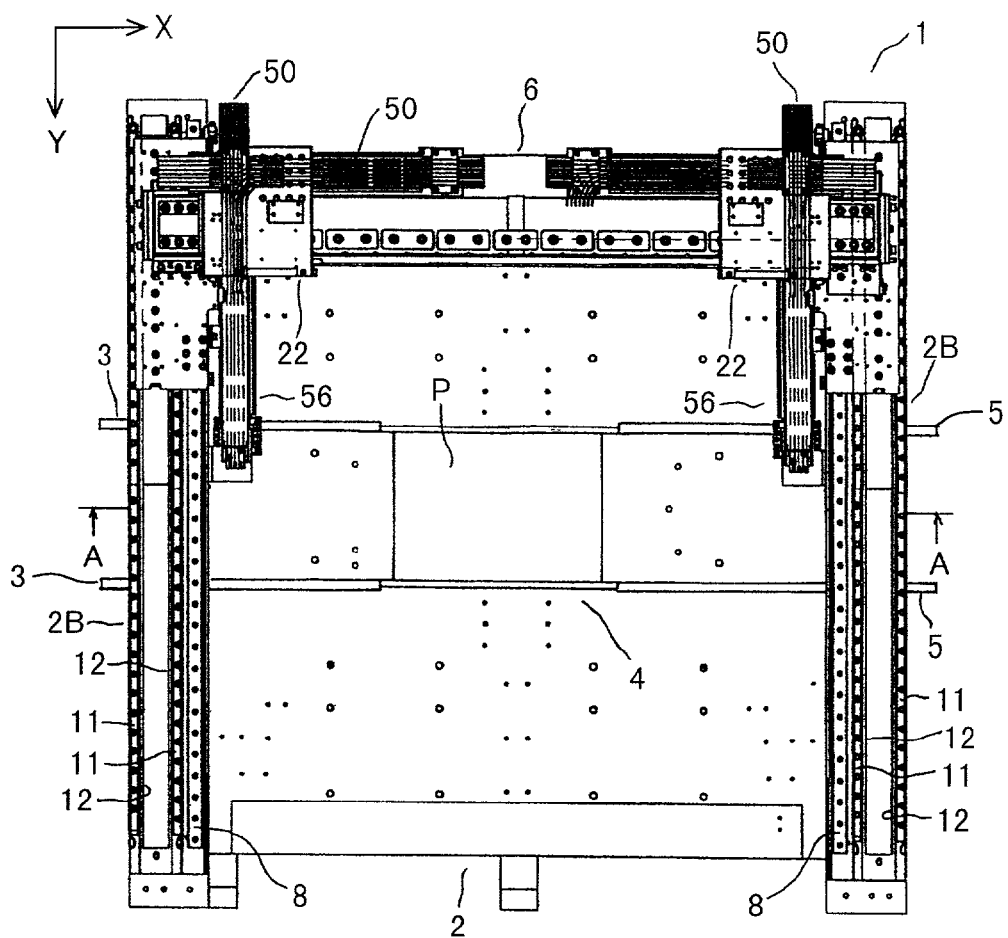
FIG. 1 is a plan view of the electronic component mounting apparatus of an embodiment of this invention.
Figure 2:
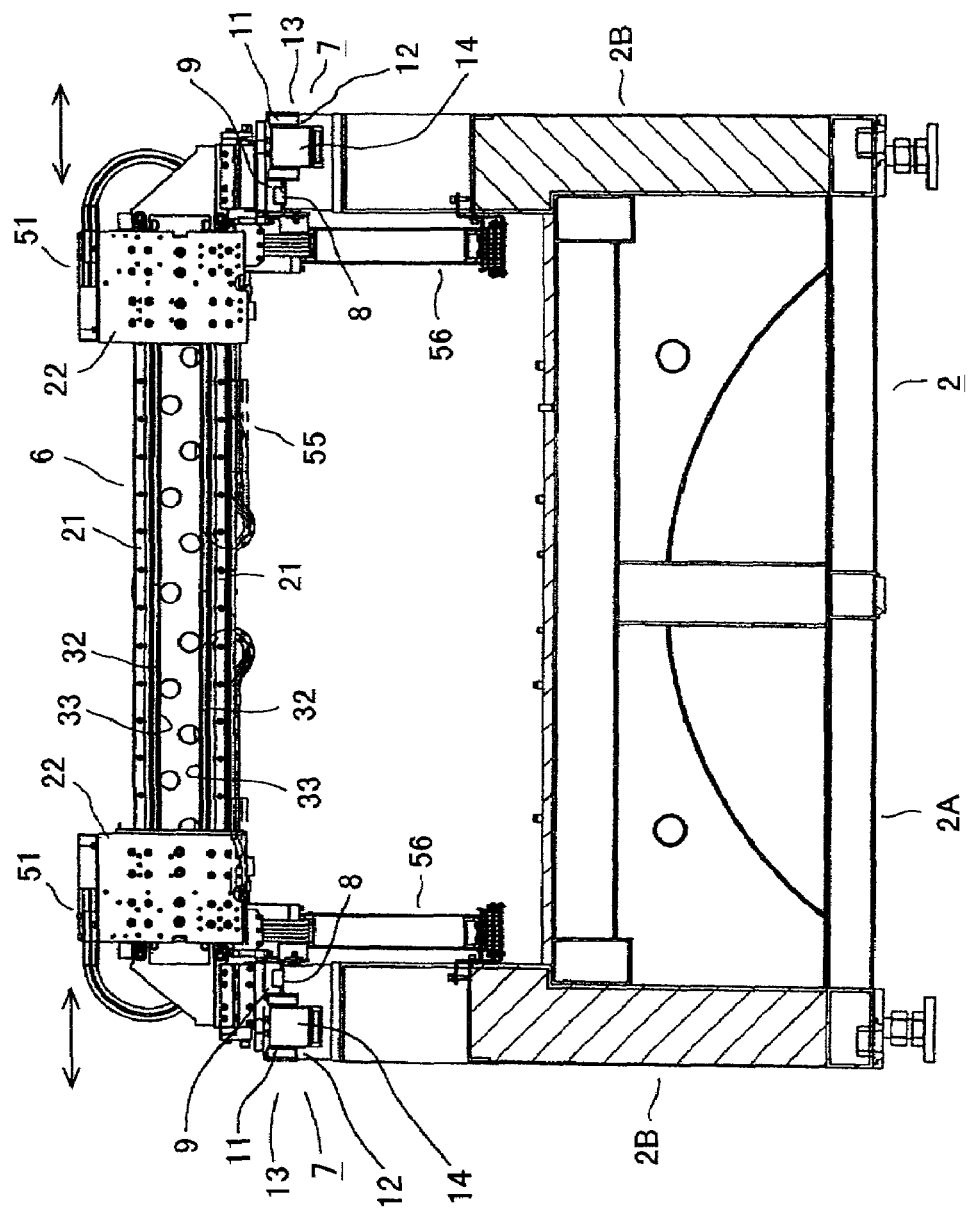
FIG. 2 is a cross-sectional view of the apparatus of FIG. 1 cut along line A—A.

The embodiment of this invention will be described by referring to the drawings above. FIG. 1 is a plan view of an electronic component mounting apparatus of an embodiment of this invention. FIG. 2 shows the cross-sectional view cut along A—A line in FIG. 1. At both front and back sides of a base 2 of the electronic component mounting apparatus 1, a plurality of component supply units (not shown), which supply various kinds of electronic components one by one to a component pick-up portion (component suction position), are provided. Also, in the middle of the mounting apparatus 1, a supply conveyer 3, a positioning portion 4, and an exhausting conveyer 5 are formed so that a print board P moves in a lateral direction. The supply conveyer 3 receives the print board P from the upper stream and sends it to the positioning portion 4. The positioning portion 4 positions the print board P by using the positioning mechanism (not shown). Then, after the mounting of the electronic component, the print board P is sent to the exhausting conveyer 5.

Reference numeral 6 denotes a beam extending in the X-direction. The beam 6 moves above the print board P on the positioning portion 4 and the component pick-up portion (component suction position) of the component supply unit along a pair of guide rails 8. The guides rails 8 are provided at right and left sides of the base 2. The beam 6 is driven by a pair of linear motors 7 located at right and left sides of the bases. These motors form a Y-axis driving source.

The base 2 comprises a main base 2A and a pair of vertical blocks 2B at its right and left sides. At the upper portion of each vertical block 2B, a guide rail 8, along which a slider 9 moves, and a pair of magnet bases 11, which horizontally extend in the longitudinal direction, are provided. The linear motor 7 has a pair of fixed elements 13 located at its right and left sides, which includes a magnet base 11 and a magnet 12. The motor 7 also includes a movable element 14 fixed on the slider 9 with a small space between the movable element 14 and the fixed element 13.

Figure 3:
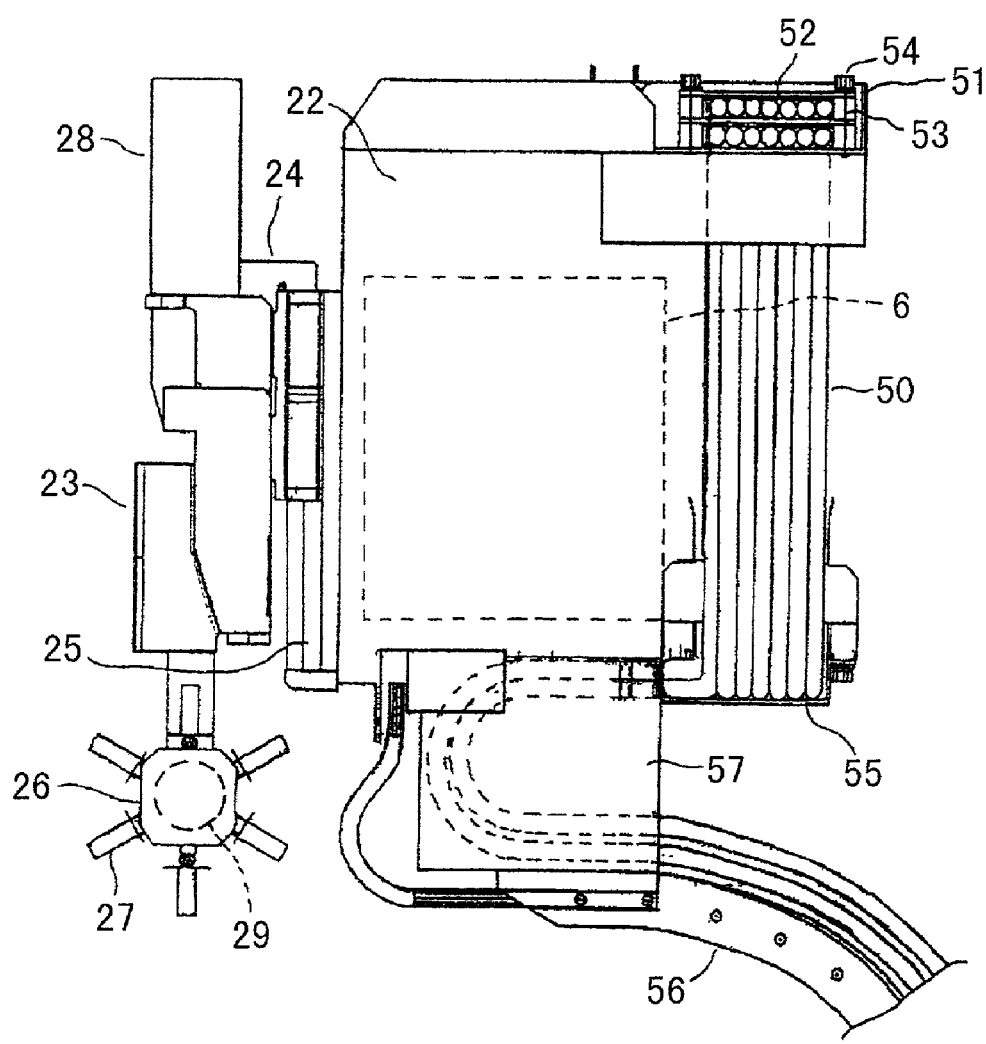
FIG. 3 is a right side view of the main part of the mounting head of the apparatus of FIG. 1.

As shown in FIG. 3, the beam 6 has head placing components 22, 22, which move in the X-direction along the guide rails 21 located at its upper and lower sides, driven by a linear motor 20. On the head placing components 22, 22, mounting heads 23, 23, which move up and down along guides 25, 25 by each of the vertical axis motors 24, 24, are formed. Each of nozzle placing components 26, 26 of the mounting head 23, 23, has 6 suction nozzles 27, which are spaced with an equal angle. Each of the nozzle mounting components 26, 26 rotates around the vertical axis by θ-axis motors 28, 28. Additionally, a nozzle selecting motor 29 arbitrarily selects one of the six suction nozzles 27. Then, the sucking part of the selected suction nozzle 27 faces downwards (facing an upper part of the component to be picked up) so that the suction nozzle picks up the electronic component by vacuum suction for mounting.

Therefore, each of the suction nozzles 27 of two mounting heads 23, 23 can move in both the X and Y directions, rotate around a vertical axis, and also move vertically.

Figure 4:
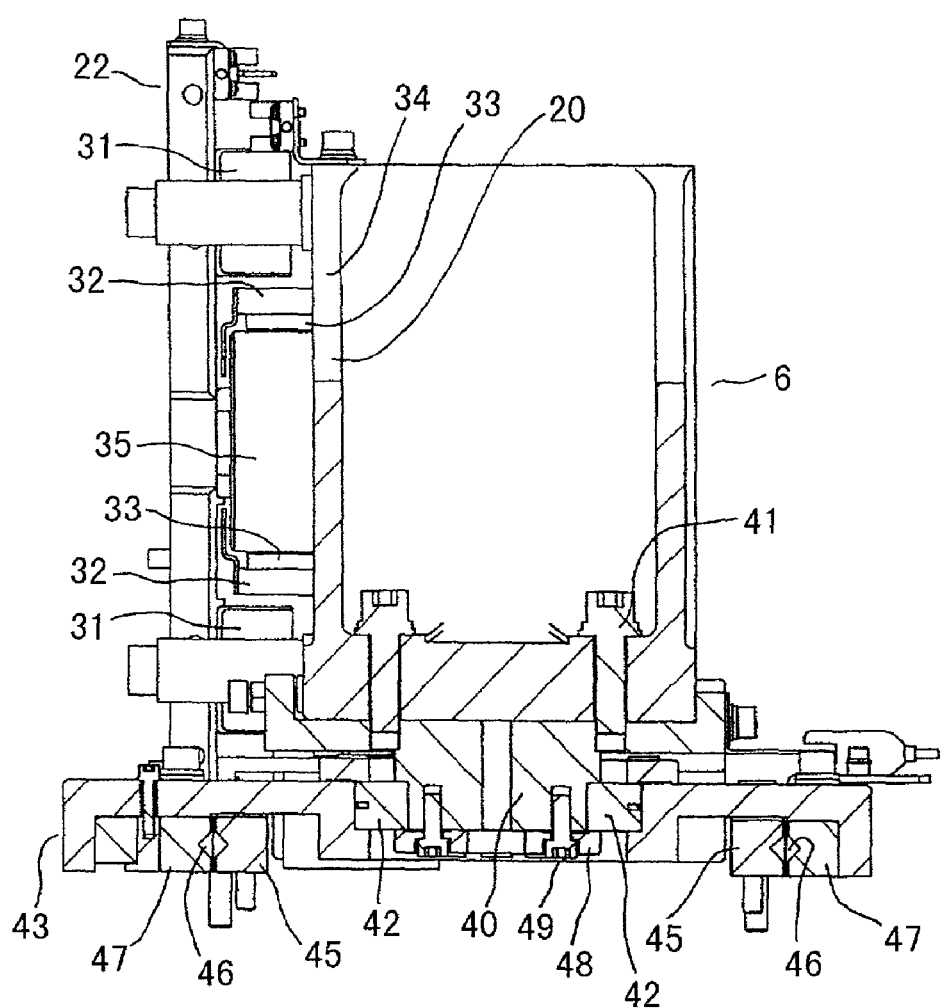
FIG. 4 is a cross-sectional view of the right end of the beam of the apparatus of FIG. 1.
Figure 5:
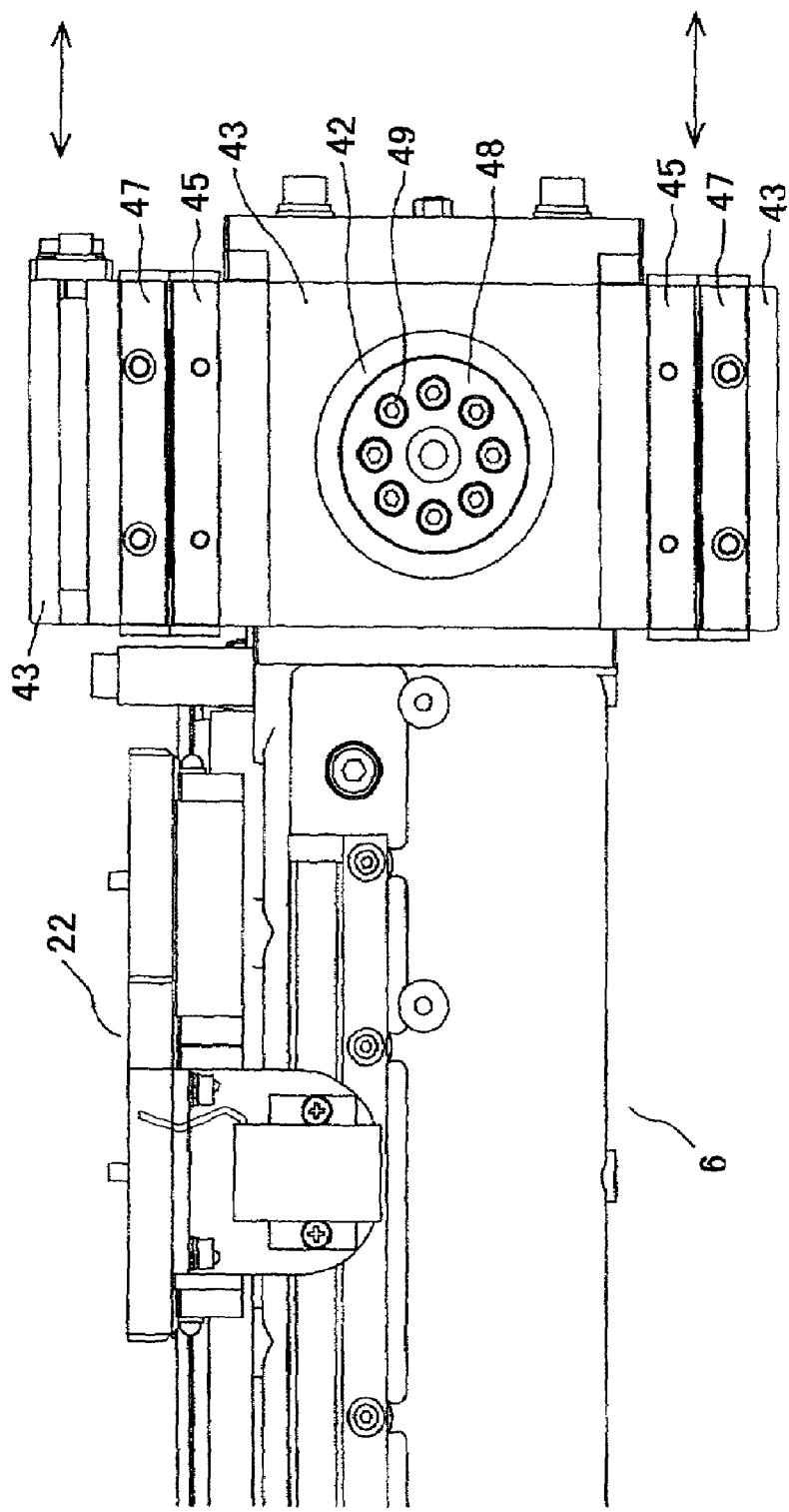
FIG. 5 shows the bottom surface of the right end portion of the beam and other parts of the beam.

As seen in FIGS. 2 and 4, a pair of guide rails 21 located above and under the beam 6 are provided at the front side of the beam 6, which has a U-shape cross-section. Also, sliders 31, which move along the rail 21, are provided at the backside of the head placing components 22, 22. A pair of magnet bases 32, which horizontally extend in a lateral direction and are located at upper and lower sides, is provided in the guide rail 21 formed at the front side of the beam 6. The linear motor 20 has a pair of fixed elements 34 including a magnet base 32 and a magnet 33, located at its right and left sides and a movable element 35 fixed at the backside of the head placing components 22, 22. There is a small space between the movable element 35 and the fixed element 34.

Also, as shown in FIG. 4, at the bottom of the right portion of the beam 6, a tube element 40, with a convex shape, is fixed with a bolt 41. A round the tube element 40, a supporting element 43 is provided with a bearing 42 fixed with a stopper board 48 and a bolt 49. Therefore, the tube element 40 and the beam 6 are rotatably supported by the supporting element 43 through the bearing 42.

Also, each of guide elements 45 is fixed to the slider 9, which can move in the longitudinal direction (the Y-direction). Each of the moving elements 47, which move along the guide element 45 through a ball 46, is fixed on the bottom of the supporting element 43 at its front and rear portions. Therefore, when the linear motor 7 operates, the slider 9 moves along the guide rail 8, and the guide element 45, fixed on the slider 9, also moves.

Figure 6:
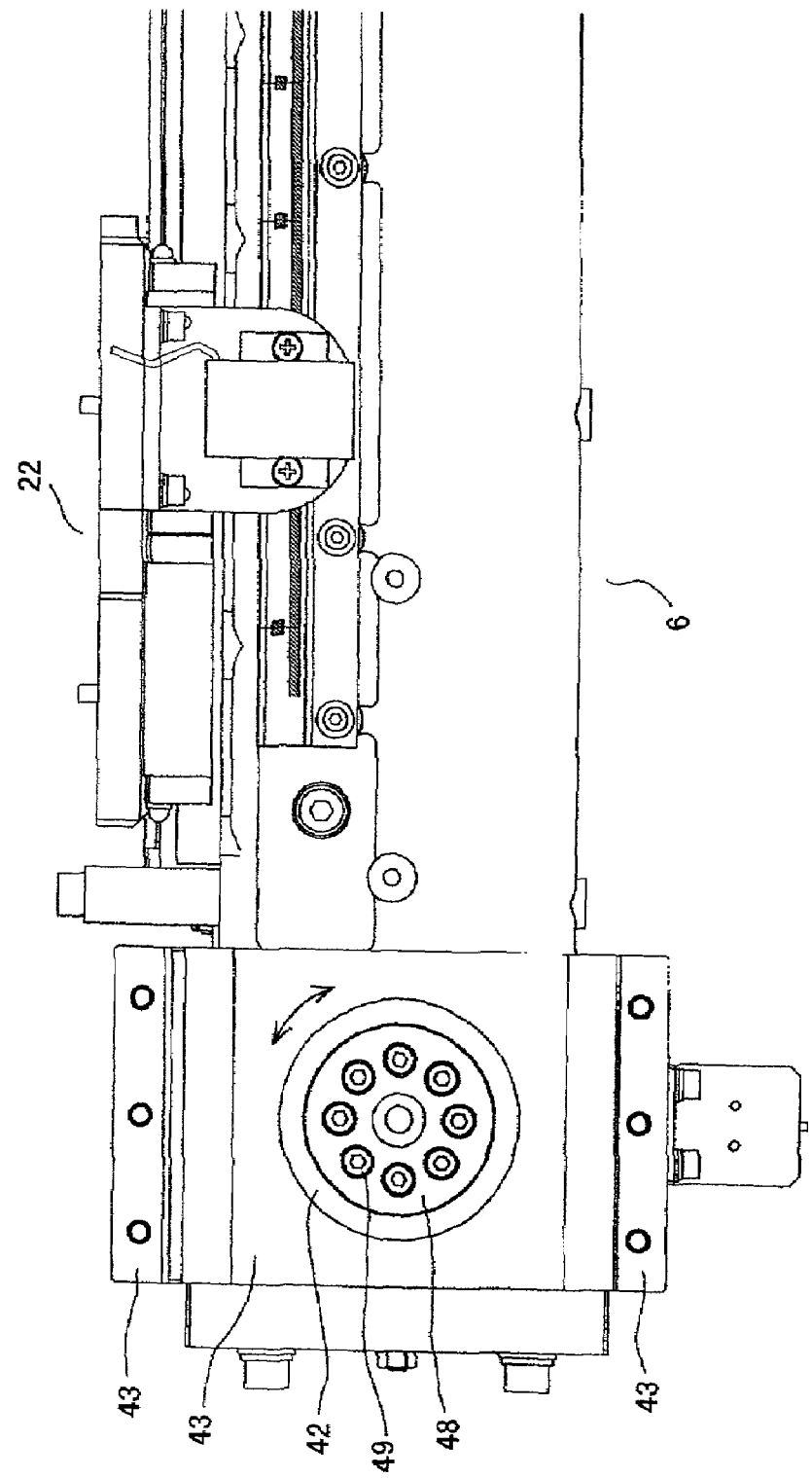
FIG. 6 shows the bottom surface of the left end portion of the beam and other parts of the beam.

As the bottom surface of the left portion of the beam of FIG. 6 shows, at the bottom of the left portion of the beam (likewise at the right portion of the beam), the converse shaped tube element 40 is fixed with the bolt 41. Around the tube element 40, the supporting element 43 is provided with the bearing 42 fixed with the stopper board 48 and the bolt 49. Therefore, the tube element 40 and the beam 6 are rotatably supported by the supporting element 43 through the bearing 42.

The supporting element 43 is fixed on the slider 9, which can move in a longitudinal direction.

Additionally, as shown in FIG. 3, flat cables 50, 50 are provided by arranging the cables and air tubes for the mounting heads 23, 23 in a row and bundling them with an adhesive. Also, one end of the flat cables 50, 50 is connected to the motors 24, 28, 29 and the mounting heads 23, 23, and the other end is connected to a controlling circuit substrate (not shown) and an air supply source (not shown). As seen in FIG. 3, the flat cables 50, 50 are retained in the condition described above with a fixing portion 51. That is, the flat cables 50, 50 are sandwiched between flat boards 52, and placed at the rear portion of the head placing components 22, 22, which are mounted on the beam 6 through a bush 53, using a screw 54.

Then, as shown in FIGS. 2 and 3, the flat cables 50, 50, are bent to be connected to the mounting head. The flat cables 50, 50 are mounted on a supporting portion 55 having an approximately U-shaped cross-section. The supporting portion is placed on the bottom part of the front side of the beam 6 along the beam 6 so that the flat cables 50, 50 will not extend fully when the head placing components 22, 22 move in a lateral direction. Furthermore, the flat cables 50, 50 are bent outwardly and disposed at a lower part of the supporting portion 55.

A cable-veyer 56 comprises a plurality of connectable pieces connected to each other, which can rotate in a certain range. The cable-veyer 56 holds the flat cables 50, 50 so that the flat cables 50, 50 are bendable. The upper portion of the cable-veyer 56 is fixed at the lower part of a bracket 57 fixed at the bottom portion of the head placing components 22, 22. A bottom portion of the cable-veyer 56 is fixed at the vertical block 2B of the base 2 with fixing equipment. That is, the cable-veyer 56 holds the flat cables 50, 50 so that the flat cables 50, 50 can bend and extend above the area where the supply conveyer 3 and the exhausting conveyer 5 transport the print board P.

Next, the operation of the mounting apparatus with above configuration will be described. First, the print board P is sent from the upper stream apparatus (not shown) to the positioning portion 4 through the supply conveyer 3. Then, the print board P is positioned by the positioning mechanism (not shown).

Next, according to the mounting data stored in a memory apparatus (not shown) regarding X and Y coordinates, rotating angles of the print board P, and location numbers of the component supply units, the suction nozzle 27, suitable for the type of electronic component selected, picks up the electronic component by suction from the component supply unit. This is done in accordance with the mounting order.

That is, the beam 6 moves along the guide rail 8 in the Y-direction, driven by the linear motor 7. The mounting heads 23, 23 move in the X-direction, driven by the linear motor 20, without corrosion and continuously move to a space above the component supply unit that stores the electronic component to be picked up.

At this point, the supply unit has already moved so that the component can be picked up at the component suction position. Thus, the suction nozzle 27, selected by the selection motor 29 of one of the mounting heads 23 goes down, driven by the vertical axis motor 24, for picking up the electronic component by suction. Then this suction nozzle 27 goes up and the suction nozzle 27 of the other mounting head 23 moves to a space above the component supply unit which stores the electronic component to be picked up next. Likewise, this suction nozzle 27 goes down to pick up the electronic component by suction.

Then, as described before, the mounting heads 23, 23 move horizontally to the space above the print board P on the positioning portion 4. Then, and each of the suction nozzles 27, 27 of each of the mounting heads 23, 23 lowers to mount the electronic component on the print board P.

As described above, since the beam 6 is moved by the linear motor 7 along the guide rail 8 to move the mounting heads 23, 23 and the suction nozzles 27, 27 in the Y-direction, the linear motor 7 generates heat.

Because thermal expansion differs between the guide rail 8, which is made of iron, and the slider 9, which is made of aluminum, the shape of the beam 6 may be distorted. In the conventional mounting apparatus, distortion of beam shape has an adverse influence on the movement of the beam along guide rails 8. This adverse influence may be reinforced by the misalignment of the guide rails 8, which are not placed completely parallel. In the worst case, the guide rail and the slider may break.

However, according to the embodiment, the supporting element 43, fixed on the slider 9, supports the left end of the beam 6 so that the tube element 40 can rotate on the bearing 42.

The supporting element 43 is fixed on the moving element 47 supports the right end of the beam so that the tube element 40 can rotate by the bearing 42. Also, each of the moving elements 47 moves along the guide element 45 fixed on the slider 9 through the ball 46 in the direction perpendicular to the guide rail 8 (the X-direction). Thus, the supporting element 43 and the beam 6 can accommodate the misalignment of the guide rails 8, which have not been placed completely parallel during assembly.

The above is a detailed description of the particular embodiment of the invention which is not intended to limit the invention to the embodiment described. It is recognized that modifications within the scope of the invention will occur to a person skilled in the art. Such modifications and equivalents of the invention are intended for inclusion within the scope of this invention.

What is claimed is:

1. An electronic component mounting apparatus comprising:
    a first guide rail and a second guide rail, the first rail being disposed along a first side of an apparatus base, the second rail being disposed along a second side of the apparatus base, and the first side and the second side being approximately parallel to each other;
    a movable beam moving along the first guide rail and the second guide rail;
    a first driving source and a second driving source driving the movable beam, the first driving source being disposed at the first side, and the second driving source being disposed at the second side;
    a mounting head moving along the movable beam driven by a third driving source; and
    a suction nozzle disposed on the mounting head, the suction nozzle picking up an electronic component by vacuum suction and mounting the electronic component on a print board,
    wherein a first end of the movable beam is rotatably supported on the first guide rail so as to be rotatable within a plane defined by the first and second guide rails, and a second end of the movable beam is rotatably supported on the second guide rail so as to be rotatable within the plane defined by the first and second guide rails and is movable in a direction approximately perpendicular to the first and second guide rails.

2. The electronic component mounting apparatus of claim 1, further comprising:
    a first slider guided by the first guide rail and rotatably supporting the first end of the movable beam;
    a second slider guided by the second guide rail and rotatably supporting the second end of the movable beam;
    a guide element disposed on the second slider;
    a moving element moving along the guide element so that the second end of the movable beam moves in a direction approximately perpendicular to the guide rails; and
    a supporting element disposed on the moving element and supporting the second end of the movable beam.

* * * * *